US007569835B2

(12) United States Patent
Frederick et al.

(10) Patent No.: US 7,569,835 B2
(45) Date of Patent: Aug. 4, 2009

(54) GATING GRID AND METHOD OF MANUFACTURE

(75) Inventors: Brian G. Frederick, Orono, ME (US); Lawrence J. LeGore, Montvillie, ME (US); Rosemary Smith, Bangor, ME (US); Scott Collins, Bangor, ME (US); Robert H. Jackson, III, Veazie, ME (US)

(73) Assignees: Stillwater Scientific Instruments, Orono, ME (US); University of Maine, Orono, ME (US)

( * ) Notice: Subject to any disclaimer, the term of this patent is extended or adjusted under 35 U.S.C. 154(b) by 294 days.

(21) Appl. No.: 11/714,691

(22) Filed: Mar. 6, 2007

(65) Prior Publication Data

US 2007/0272875 A1 Nov. 29, 2007

Related U.S. Application Data

(60) Provisional application No. 60/779,690, filed on Mar. 6, 2006.

(51) Int. Cl.
*H01J 29/52* (2006.01)
*H01J 37/063* (2006.01)
*G01D 59/44* (2006.01)
*H01J 49/00* (2006.01)

(52) U.S. Cl. ................... 250/396 R; 250/286; 250/287; 250/281; 250/293; 313/348; 438/927; 438/977; 29/825; 29/603.15

(58) Field of Classification Search ............. 250/396 R, 250/286, 287, 281, 293; 313/348; 438/927, 438/977; 29/825, 605.15
See application file for complete search history.

(56) References Cited

U.S. PATENT DOCUMENTS 3,999,263 A 12/1976 Marshall et al.

(Continued)

FOREIGN PATENT DOCUMENTS

WO WO 03/065763 A1 8/2003
WO WO 2004/097879 A2 11/2004

OTHER PUBLICATIONS

Vlasak, P.R., et al., "An Interleaved Comb Ion Deflection Gate for *m/z* Selection in Time-of-Flight Mass Spectrometry," *Rev. Sci. Instrum.*, 67(1):68-72 (1996).

(Continued)

*Primary Examiner*—Nikita Wells
(74) *Attorney, Agent, or Firm*—Hamilton, Brook, Smith & Reynolds, P.C.

(57) ABSTRACT

The present invention relates generally to grids for gating a stream of charged particles and methods for manufacturing the same. In one embodiment, the present invention relates to a Bradbury-Nielson gate having transmission line grid elements. In one embodiment is a feed structure for a gating grid where a drive source is coupled to a feeding transmission line with the same geometry as the chopper and continues with the same geometry to a termination transmission line. Also included is a method for fabricating a gate for charged particles which includes micromachining at least two gate elements from at least one wafer, wherein each gate element includes at least one grid element; metalizing the grid elements; and assembling the gate elements such that the grid elements of the gate elements are interleaved, thereby forming a Bradbury Nielson gate.

19 Claims, 14 Drawing Sheets

U.S. PATENT DOCUMENTS

| | | | | |
|---|---|---|---|---|
| 4,150,319 | A | 4/1979 | Nowak et al. | |
| 5,465,480 | A | 11/1995 | Karl et al. | |
| 5,986,258 | A * | 11/1999 | Park | 250/287 |
| 6,781,120 | B2 * | 8/2004 | LeCursi et al. | 250/286 |
| 6,782,342 | B2 | 8/2004 | LeGore et al. | |
| 6,977,381 | B2 | 12/2005 | Charles, Jr. et al. | |
| 7,067,803 | B2 * | 6/2006 | Zare et al. | 250/287 |
| 7,120,998 | B2 * | 10/2006 | LeCursi et al. | 29/825 |
| 2001/0052576 | A1 | 12/2001 | Shimada et al. | |
| 2001/0054690 | A1 | 12/2001 | Shimada et al. | |
| 2003/0048059 | A1 | 3/2003 | LeCursi et al. | |
| 2004/0144918 | A1 | 7/2004 | Zare et al. | |
| 2004/0231150 | A1 | 11/2004 | Charles, Jr. et al. | |
| 2005/0258514 | A1 | 11/2005 | Smith et al. | |

OTHER PUBLICATIONS

Honkanen, A., et al., "Gas-silicon Detector Telescope for Charged Particle Spectroscopy," *Nuclear Instrum. and Methods in Physics Research*, Section A, 395:217-225 (1997).

Kimmel, J.R., et al., "Novel Method for the Production of Finely Spaced Bradbury-Nielson Gates," *Rev. Sci. Instrum.*, 72(12):4353-4357 (2001).

* cited by examiner

GATING GRID AND METHOD OF MANUFACTURE

RELATED APPLICATIONS

This application claims the benefit of U.S. Provisional Patent Application No. 60/779,690 filed Mar. 6, 2006, the entire contents of which is incorporated herein by reference.

BACKGROUND OF THE INVENTION

The present invention relates generally to gating grids and methods for manufacturing grids for gating a stream of charged particles.

Certain types of particle measurement instruments, such as ion mobility spectrometers, make use of a gating device for turning on and off a flowing stream of ions or other charged particles. This is accomplished by disposing a conducting grid within the path of the ions. Alternately energizing or de-energizing the grid then respectively deflects the ions or allows them to flow.

The most common method for implementing such a grid uses an interleaved comb of wires, also referred to as a Bradbury-Nielson gate. Such a gate consists of two electrically isolated sets of equally spaced wires that lie in the same plane and alternate in potential. When a zero potential is applied to the wires relative to the energy of the charged particles, the trajectory of the charged particle beam is not deflected by the gate. To deflect the beam, bias potentials of equal magnitude and opposite polarity are applied to the two sets of wires. This deflection produces two separate beams, each of whose intensity maximum makes a corresponding angle, alpha, with respect to the path of the un-deflected beam and deflects them from their normal trajectory.

SUMMARY OF THE INVENTION

In one preferred embodiment is a feed structure for a gating grid or "chopper" (such as, but not limited to a Bradbury-Nielsen Gate) where a drive source is coupled to a feeding transmission line with the same geometry as the chopper and continues with the same geometry to a termination transmission line. The termination transmission line is completed to a termination network, such as a high pass network.

A biasing network may optionally be disposed between the drive source and feeding transmission line.

The grid is, in one embodiment, arranged so that two or more individual wires are coupled to a respective feed wire.

In addition, the grid may be fabricated as two halves, with all grid elements of one polarity formed on one half, and all grid elements of the other polarity on the other half.

The present invention also includes a method for fabricating a gate for charged particles. In one embodiment, the method includes micromachining at least two gate elements from at least one wafer, wherein each gate element includes at least one grid element; metalizing the grid elements; and assembling the gate elements such that the grid elements of the gate elements are interleaved, thereby forming a Bradbury Nielson gate.

In one embodiment, a method for fabricating a gate for charged particles, includes micromachining a first gate element from a wafer, wherein the gate element includes a plurality of grid elements, and metalizing the grid elements, thereby forming a first unipotential grid. In another embodiment, the method further includes micromachining a second gate element from a wafer, wherein the gate element includes a plurality of grid elements; and metalizing the grid elements, thereby forming a second unipotential grid. In yet another embodiment, the method further includes assembling the first and second unipotential grids such that the grid elements of the unipotential grids are interleaved, thereby forming a Bradbury Nielson gate.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION OF THE INVENTION

Figure 1:
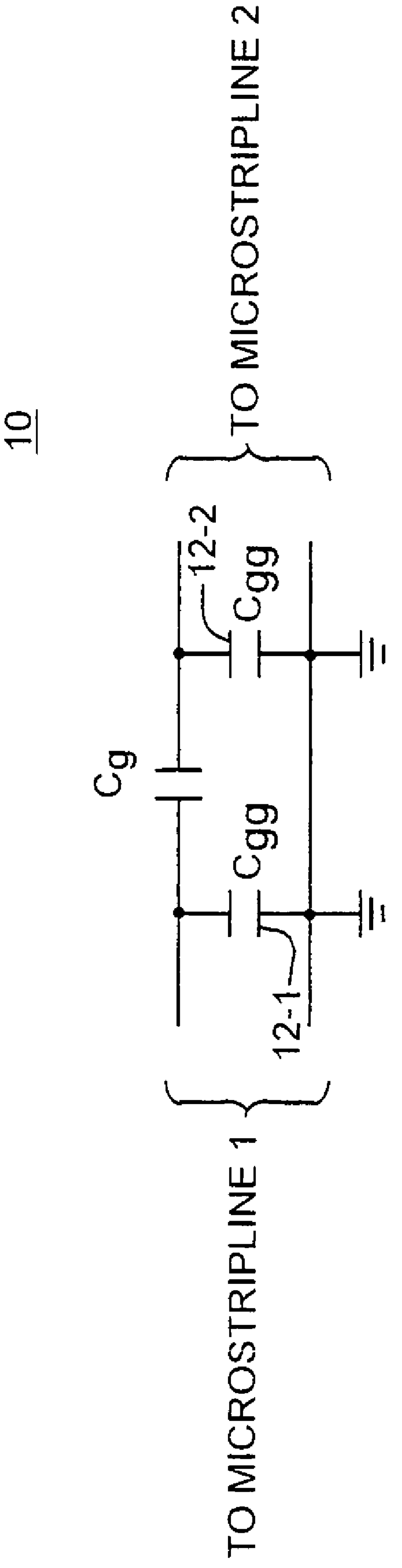
FIG. 1 illustrates a circuit diagram of a capacitive pi model for a drive feed structure and grid wires.

A description of example embodiments of the invention follows.

The present invention relates generally to grids for gating a stream of charged particles and methods for manufacturing the same. In one embodiment, the present invention relates to a Bradbury-Nielson gate having transmission line grid elements. As the timescale of switching the potentials approaches the sub-nanosecond regime, the electrical characteristics of the device become important. The dimensions of the grid elements determine the spatial extent of the fields which penetrate across the plane of the grid, such that finer mesh grids have improved optical properties. This invention relates to methods of fabrication of the device and means of achieving ultra fast switching times by designing the grid to be a part of a transmission line. The fabrication method also provides advantages over other fabrication methods.

Recently, Bradbury-Nielson Gates have been used for gating electron and ion beams in time-of-flight (TOF) spectrometers in the fields of electron spectroscopy and mass spectrometry, for example, as described in U.S. Pat. No. 6,782, 342, incorporated by reference herein in its entirety. We have shown that by modulating with pseudo random binary sequences and using probability based estimation methods that include a description of the actual response function of the gate, orders of magnitude improvements in resolution and in-scan dynamic range can be achieved compared to the traditional approach of cross correlation using an assumed, ideal, response function. For the probability based data recovery method, the time resolution is controlled by the rise time, rather than the width of the single pulse duration, and eliminating reflections of the electrical signals is critical to cleanly chopping the beam, which affects the in-scan dynamic range. In the electron spectrometer, pulse durations of a few nanoseconds with rise times of hundreds of picoseconds are required to achieve state of the art resolution. In the mass spectrometer, achieving similar rise times will allow instruments to be designed with resolution exceeding that of the current state-of-the-art TOF instruments.

One approach to manufacturing a gating grid is disclosed in U.S. Pat. No. 4,150,319 issued to Nowak, et al. In this technique, a ring-shaped frame is fabricated from a ceramic or other suitable high temperature material. The two sets of wires are wound or laced on the frame. Each set of wires is actually a single, continuous wire strand that is laced back and forth between two concentric series of through-holes that are accurately drilled around the periphery of the frame.

A further method was described in U.S. Patent Publication No. US-2003-0048059-A1, as published on Mar. 13, 2003, incorporated by reference herein in its entirety. In that method, the grid is fabricated using a substrate formed of a ceramic, such as alumina. The substrate serves as a rectangular frame for a grid of uniformly spaced wires stretched across a center rectangular hole. On either side of the frame, nearest the hole, a line of contact pads are formed. Adjacent the line of contact pads, on the outboard side thereof, are formed a pair of bus bars. The contact pads and bus bars provide a way to connect the wires into the desired two separate wire sets of alternating potential. Specifically, a metal film is deposited on the surface of both sides of the ceramic through vacuum evaporation of gold, using chrome as an adhesion layer, for example. The metal film is then patterned on the front side to form the conducting elements on either side of the hole. The desired metallization pattern can be defined by a photo-resist and chemical-etch process, a lift-off process, or by using a physical mask during an evaporation. In a next sequence of steps, individual grid wires are attached to the fabricated frame. In this process, a spool of wire is provided that will serve as the grid wires, with a tensioning arrangement provided to place constant tension on the wire as the wires are attached to the substrate.

In yet another approach, micromachining can be used to form the gate. For example, in U.S. patent application Ser. No. 11/124,424, filed on May 6, 2005, incorporated by reference herein in its entirety, describes a grid micromachined from silicon and a method for fabricating same. Instead of metal wires or plates electrically isolated and supported by an insulating frame, the grid can be composed entirely of silicon. This type of chopper is fabricated from a silicon-on-insulator (SOI) wafer such as is typically used in the Micro-Electro-Mechanical Systems (MEMS) and/or semiconductor industry. An SOI wafer has three layers, including a highly doped device layer on the order of 100 microns thick, an insulating silicon oxide layer on the order of 2 microns thick, and a handle layer 300 to 400 microns thick. The grid elements are made from highly doped silicon to provide electrical conductors with the required alternating electrical potentials. The alternate grid elements are connected by bus bars on one side, also made from highly doped silicon, and the opposite side of each bus bar ends on the thin silicon oxide layer, which provides mechanical support. Part of the bus bars are enlarged and metalized to provide bond pads for connection to associated electronic circuits. These electrical conductors are also isolated from a silicon support frame by the layer of silicon oxide. The grid elements have a rectangular cross section rather than the circular cross section of wires often used for Bradbury-Neilson grids.

The electrically conducting grid elements and bus bars are fabricated in the device layer using anisotropic deep reactive ion etching (DRIE). In one particular embodiment, the so-called Bosch process is used to fabricate these structures, which provides trenches with a highly vertical side wall profile. Grid elements with a cross section of 5 microns by 100 microns are possible using this process. The hole(s) in the supporting frame (handle layer) is also created by DRIE. The remaining oxide layer between the grid elements can be removed by various well-known dry or wet etch methods.

As was the case in all of the other known methods, the electrical signals were fed from opposite sides of the grid and the opposing end of the grid elements simply ended on an isolated mechanical support.

In previous versions of the Bradbury-Nielsen Gate (BNG), the electrode structures connecting the drive signals to the interdigitated electrodes were constructed to feed the signals from opposite sides of the gate. For example, in one embodiment of U.S. Patent Publication No. US-2003-0048059-A1, the signals from the source are connected to the gate by means of two microstriplines, one on each side of the grid, such that one of the grid wires is bonded to microstripline number one, extends across the gate region and is bonded to an opposite pad, and similarly the other set of grid wires starts at microstripline number two on the opposite side extending across the gate region to its pad. In an attempt to provided an impedance matched load to the drive source, the dimensions of these microstriplines were set to provide a characteristic impedance that matched the local impedance of the drive source, which is commonly a transmission line, for example a coaxial transmission line. Furthermore, the end of the microstripline, opposite to the drive source, is terminated with a resistor whose value matches the characteristic impedance of the microstripline.

We have found that Time-domain Reflectometry (TDR) measurements of the drive feed structure, described above, show an anomalously high capacitance, from which the rising and falling edges of the drive signal reflect, travel towards the source, and subsequently are partly reflected back to the gate, thus creating unwanted delayed signals at the gate. To understand this anomalous capacitive loading we considered the loading effects of each grid wire attached along each microstripline. The simplest approach was to consider each pair of grid wires to act as a lumped capacitor extending from one microstripline to another, however, the capacitance between the grid wires is too small to account for the anomalous load capacitance. We compared the results of the TDR measurements in combination with further Time-Domain Transmission (TDT) measurements to various lumped passive component models, and found that the loading can be modeled as a capacitive pi network with a capacitor Cg (10) between the microstriplines, and two capacitors Cgg (12-1, 12-2), one on each side of the grid, connected between its respective microstripline and the microstriplines' ground plane, as shown in FIG. 1. When we estimated the typical parasitic components, for example the inductance of the drive connections to the microstriplines, then the TDR and TDT measurement were reconciled to some aspects of the model, but the model did not explain the origin of the capacitors Cgg 12.

Figure 2:
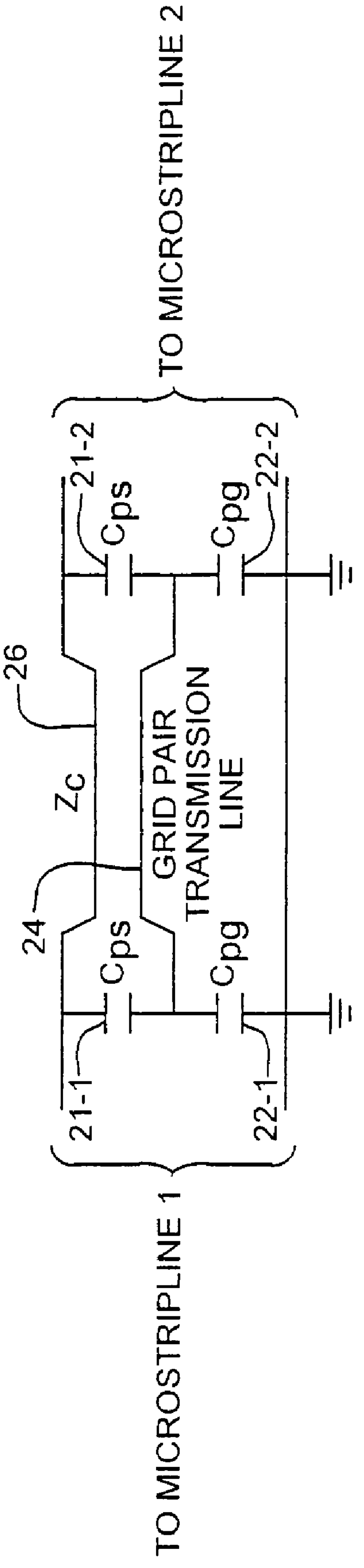
FIG. 2 illustrates a circuit diagram of a model that accounts for grid wire pairs as a transmission line.

For the high frequency components of the rising and falling edges of the drive signal, we considered that the alternating grid wires behave as a multi-conductor transmission line (like a ribbon cable), driven in an odd mode. The loading along each microstripline was then seen locally as a resistive load equivalent to the odd mode characteristic impedance of a grid pair connected between the microstripline and the pad holding the opposite wire of the pair, as described by the circuit of FIG. 2. The pad appears to act as capacitance Cpg (22-1, 22-2) to both ground and back to the microstripline Cps (21-1, 21-2). Each pair of wires provides a complex impedance Zc (26) that is predominantly capacitive and distributed along the microstripline, thus explaining the Cgg capacitance of the lumped capacitive pi model in FIG. 1. The coupling capacitance Cg can be understood as a capacitive voltage divider created by Cpg and Cps at the feed of each grid pair, thus determining the fraction of the high frequency edge signals across each end of the grid transmission line 24.

The presence of the capacitances at the feed point of the BNG appear to limit the rise and fall times of the BNG fields according to the RC time constant of the source at the feed point. For example, if one connects the drive source to the BNG via 50 ohm coaxial cables that are available for use in a vacuum environment for the Bradbury-Nielsen gate, then the rise/fall time is Trise/fall=2.2 (50 ohm) Cgg, or 110 ps per picofarad of Cgg. The values of Cgg are of the order 10 pf, which is typically seen in many electronic devices. So, in this example the rise/fall time of the BNG would be limited to 1100 ps, which will limit the time resolution of the time-of-flight spectrometer using the BNG. Furthermore, without being bound to any particular theory, we have discovered that reflected signals propagate from Cgg back towards the source and, due to discontinuities at connectors and at the source are reflected back toward the BNG, thus distorting the modulation on the BNG. Also, it has been discovered that the switching efficiency of the source can be deteriorated by the reflected signals.

One such solution to this is to place a low impedance source "close" to the BNG, which will reduce the RC time constant, as suggested by Zare, et al., U.S. Patent Publication No. 2004/0144918 A1. However, this only reduces the rise/fall time, leaving the source to drive a capacitive load, thus creating more heat than necessary. Another problem is that, even placing the source as close as possible to the BNG to try to eliminate the rise/fall time from multiple reflections back-forth between the source and the BNG, can still add up to hundreds of picoseconds of delay.

The discovery that the BNG can be modeled as a multi-conductor transmission line leads to an embodiment of the present invention wherein a grid comprises a transmission line with the signals appearing on one side of the grid and propagating across the grid to the other side to a proper termination thus eliminating the reflections and providing a real impedance to the drive source. If the transmission lines from the drive source to the BNG and from the BNG to the termination are matched and properly connected to the BNG then the pulse rise times will no longer be dominated by the feed capacitances discussed above. Finally, one embodiment of the present invention, wherein the BNG is constructed as two halves with all of the grid elements of one polarity on one half and all the grid elements of the other polarity on the other half, provides a simplification to the connection of the grids to their respective feed connections without having connection of one polarity having to jump over the other.

Viewing the BNG as a transmission line operated in an odd-mode with signals V+ and V− applied to alternate electrodes, we can determine the differential characteristic impedance of the line as, $$Z_{diff} = \frac{\sqrt{\varepsilon_r}}{c_{diff} v_c},$$

where $\epsilon_r$ is the dielectric constant of the medium (vacuum in this case), $c_{diff}$ is the differential capacitance per unit length, and $v_c$ is the speed of light in a vacuum. For example, an infinitely long BNG of infinitely many wires has a closed form potential, $$\psi(x, y) = \frac{\lambda}{2\pi\varepsilon}\ln\left(\frac{\cosh\left(\frac{\pi x}{d}\right) + \sin\left(\frac{\pi y}{d}\right)}{\cosh\left(\frac{\pi x}{d}\right) - \sin\left(\frac{\pi y}{d}\right)}\right),$$

where λ is the absolute charge per unit length on one of the wires, given by, $$\lambda = \frac{2\pi\varepsilon V_{app}}{\ln\left(\frac{1 + \cos\left(\frac{\pi R}{d}\right)}{1 - \cos\left(\frac{\pi R}{d}\right)}\right)}.$$

From this expression, one easily derives the differential capacitance per unit length per pair of BNG elements and subsequently one has the differential characteristic impedance, $$Z_{diff} = \frac{1}{\pi v_c \varepsilon_0 \sqrt{\varepsilon_r}}\ln\left(\frac{1 + \cos\left(\frac{\pi R}{d}\right)}{1 - \cos\left(\frac{\pi R}{d}\right)}\right).$$

Figure 3:
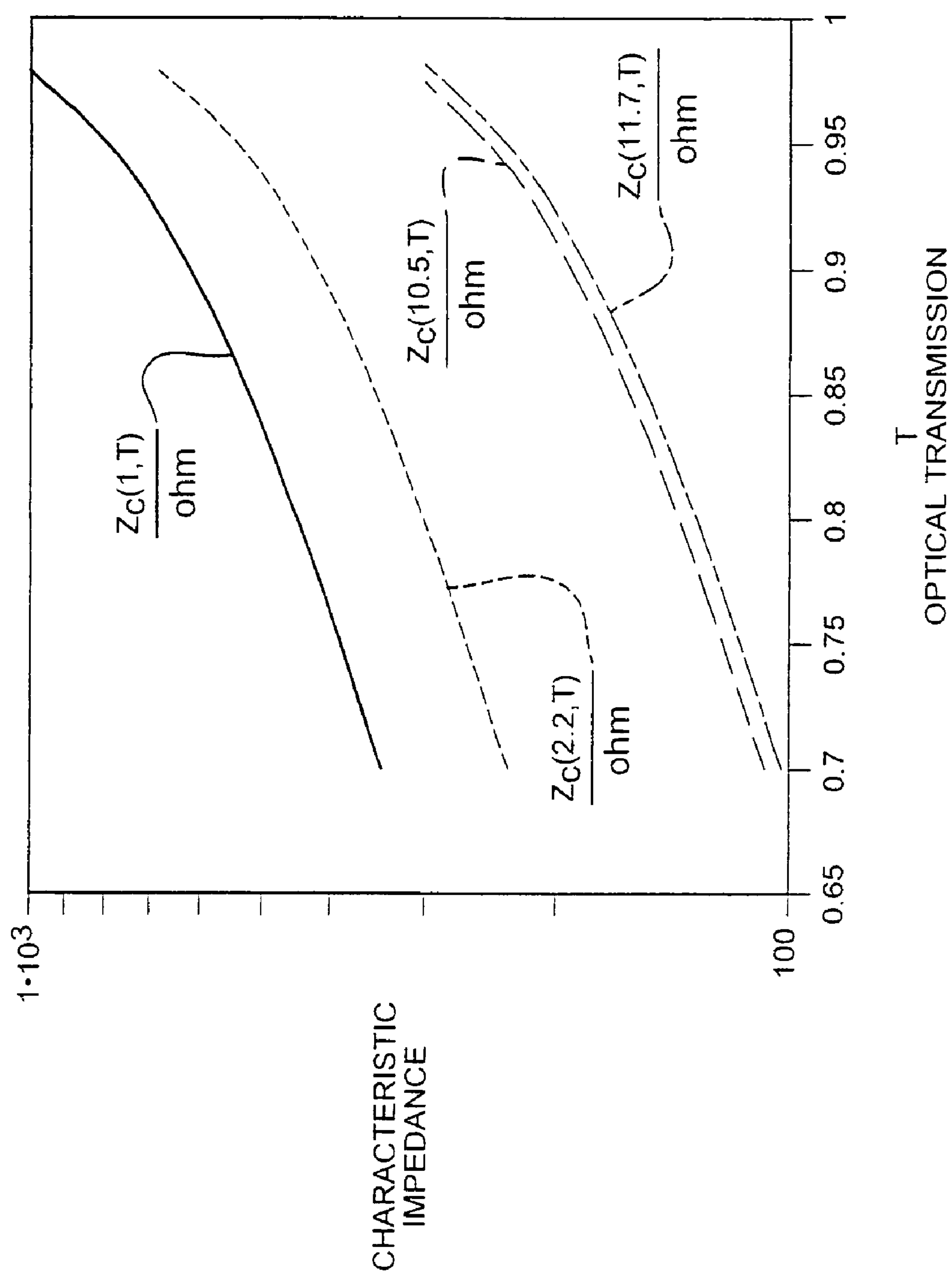
FIG. 3 is a plot of characteristic impedance per unit length for pairs of wires in a Bradbury-Nielsen gate for various values of dielectric constant.

If one defines the optical transmission T of the BNG by $$1 - T = \frac{2R}{d}$$

then one can plot the differential impedance of the wire BNG versus optical transmission as shown in FIG. 3.

More particularly, FIG. 3 illustrates the differential characteristic impedance per pair of wires in the Bradbury- Nielsen Gate versus optical transmission for values of relative dielectric constant $\epsilon_r$=1, 2.2, 10.5, 11.7.

As one can see from FIG. 3, for a BNG completely isolated from any support structures ($\epsilon_r$=1) with T=0.9, that is 90% optical transmission of the beam through the gate, the impedance per pair is 609 ohms. Thus, for a 50 pair gate the overall characteristic impedance is 12.2 ohms, which is low compared to the typical 50 ohm transmission lines available for vacuum use.

This analysis leads to a new feed structure for the gate, in its electrically simplest form, has a source that drives a transmission line with the same geometry as the chopper and continues with the same geometry to the termination. This helps eliminate reflections from transitions from the source through the beam chopping region to the termination. Furthermore, the grid wires can be extended to a load that terminates the high frequency components of the signal in the characteristic impedance of the grid. If this termination consists of a passive filter network designed to terminate the high frequency components, whose quarter wavelengths are similar or smaller than the distance from the source to the termination, then the power created in the termination can be kept low.

Alternatively, the transmission lines can be extended using fewer conductors, with N pairs of the grid transmission lines connected to a pair of the extending transmission lines such that the differential impedance of a pair in the extending transmission line is Zext=Zgrid_pair/N. This concept is illustrated in FIG. 4 for the case in which N=2; i.e., 4 source feed lines are connected to 8 gate grid elements on each half of the gate using the method described below.

Figure 4:
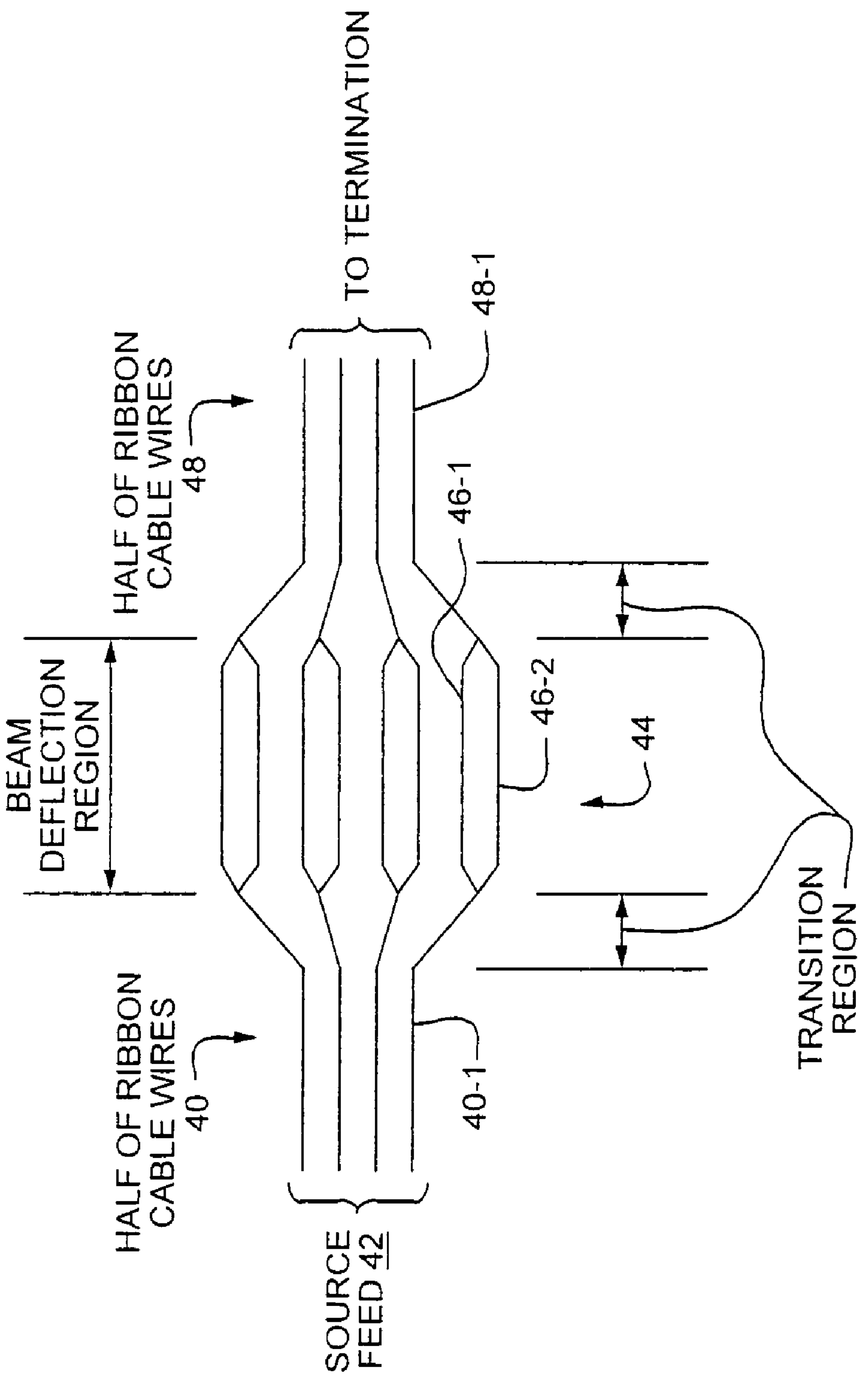
FIG. 4 illustrates a circuit diagram for one embodiment of a feed.

More specifically, FIG. 4 illustrates one method of connecting the source transmission line of characteristic impedance, $Z_{ext}$ to N pairs of grid elements such that the characteristic impedance of the source matches the grid. The same process can be used to couple the signals off the other side of the grid to a termination point. Thus, one half (N/2) drive wires 40 are coupled from source feed 42 to the wire grid 44. The individual wires 46 in the grid 44 are coupled in pairs (e.g. 46-1 and 46-2) to a respective feed wire 40-1. The other end of the pair (46-1, 46-2) is coupled to a corresponding termination line 48-1, of which there are a number 48 which is the same drive wires 40.

Figure 5:
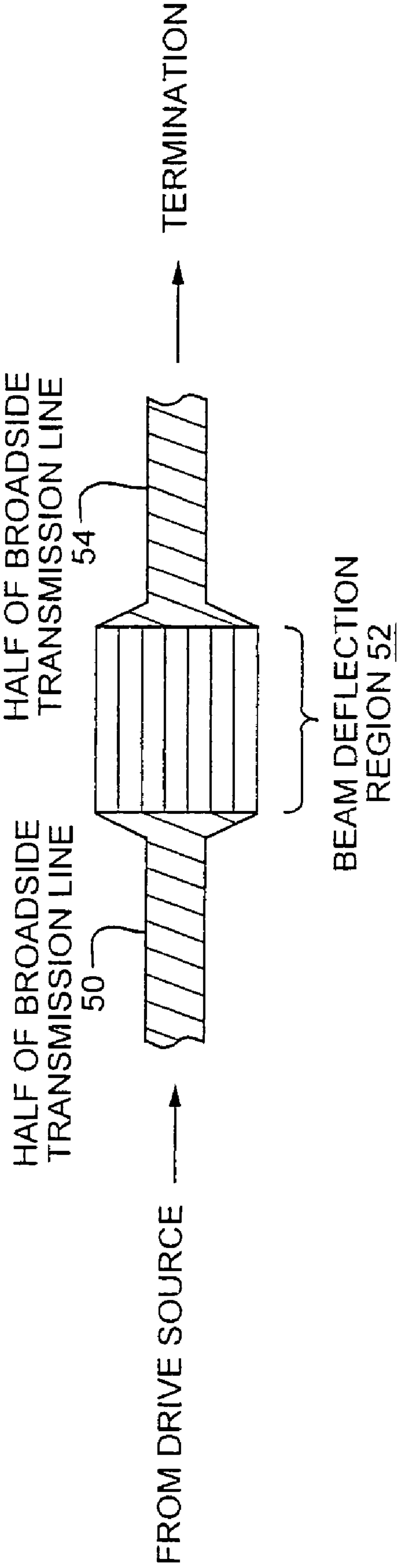
FIG. 5 is another embodiment using a broadside transmission line.

The extending transmission line can also be a line with inherently low odd mode impedance, like a "broadside stripline". In one embodiment, each conductor of the broadside line is part of the respective half of the "two half" fabricated gate in the method described below. FIG. 5 illustrates such a connection of a broadside stripline to the grid as part of a transmission line BNG.

FIG. 5 is specifically an embodiment in which one broadside line 50 feeds more than two, e.g., eight (8) grid lines 52, and coupled to a termination by a second broadside line 54.

A fabrication method described herein, whereby each set of grid elements, e.g., electrodes, is created on a separate nesting half, also allows a great simplification in connecting the grid to the drive transmission line and to the termination transmission line. Because each half has electrodes of only one polarity, the electrodes can be connected by appropriate deposition of a metal layer on that half without the need to cross lines of the other polarity. Furthermore, there is great flexibility in the form of the connections to the source or the termination transmission lines: the structure allows a direct N wire ribbon cabled transmission line connection to N grid elements, or connection of several grid electrodes per transmission line electrode, or all grid elements of one polarity to half of either a broad side or edgewise stripline transmission line.

Figure 6:
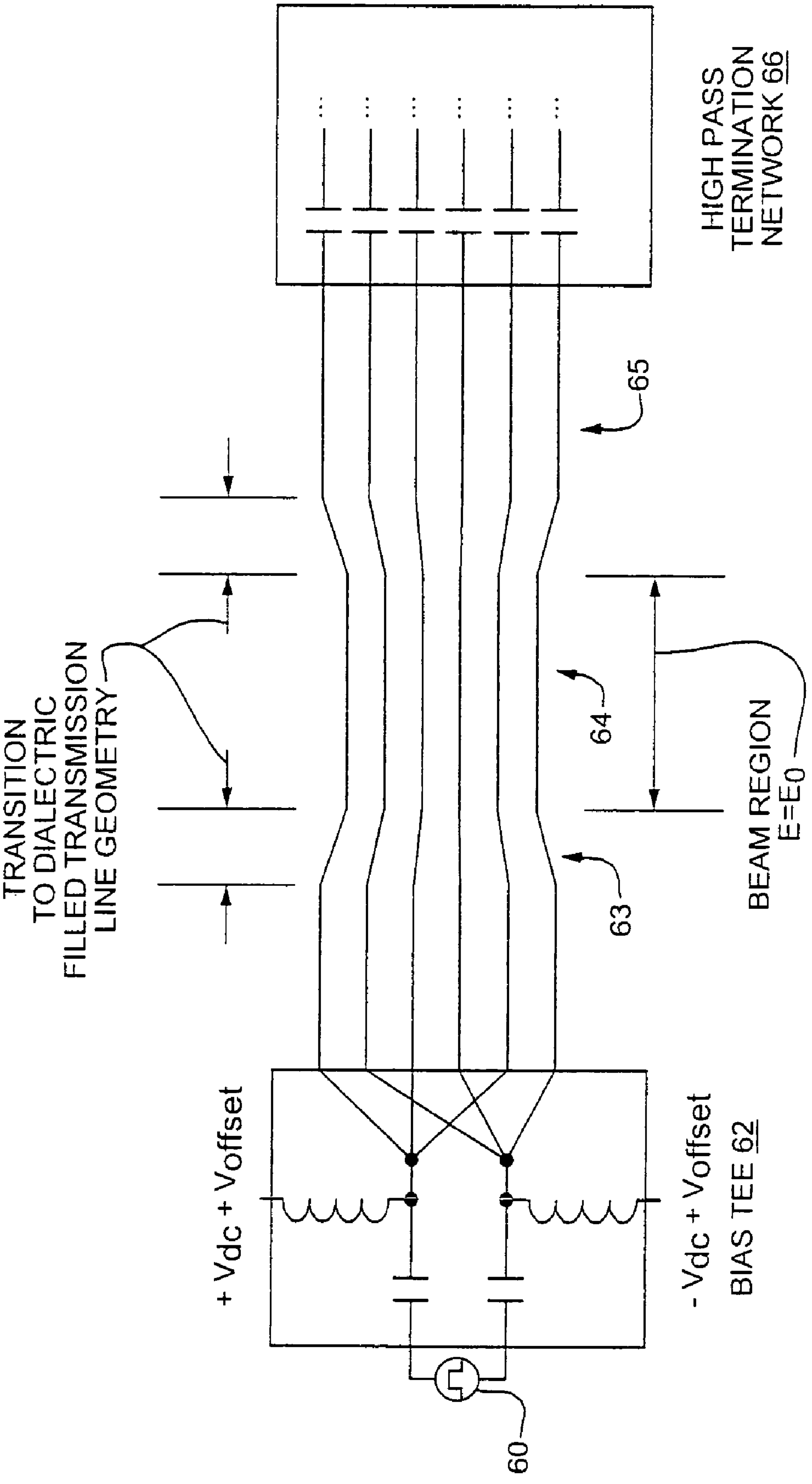
FIG. 6 is another embodiment using a bias tee feed network.

The overall system can consist of a drive source 60, a balanced biasing network 62, a feeding transmission line 63 that transitions to the transmission line of the BNG 64, then transitions back to the termination transmission line 65 to feed a high pass termination network 66, as illustrated in FIG. 6. A bias tee 62 provides a means of DC isolation so the chopper can be biased to an arbitrary average voltage. This provides low reflections at the grid elements and therefore a good reproduction of the drive signal. It also effectively facilitates a transition from a unipolar drive signal to a balanced pair feed structure, simplifying the design of the drive circuit 60. The high pass termination network 66 looks like an open circuit at low frequencies, greatly reducing the low frequency heat dissipation requirements without causing reflections at the switching edges, because the termination 66 is well matched at high frequencies.

The bias tee network 62 can be modeled as an ideal capacitor on the input line and an indicator to the bias terminal. The output transitions to multiple chopper (grid) wires. The bias tee 62 can be implemented as two separate network with a single transmission line for each; or it may be a balanced bias tee network.

Figure 7A:
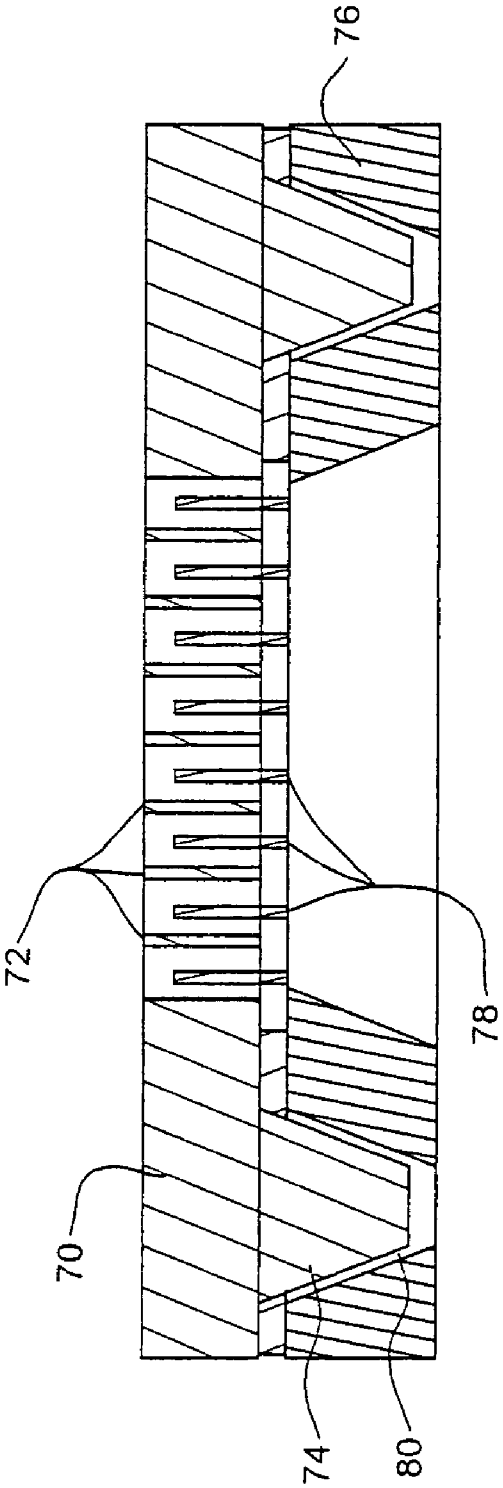
FIG. 7A is a cut away view of a Bradbury-Nielsen gate according to one embodiment of the present invention.
Figure 7B:
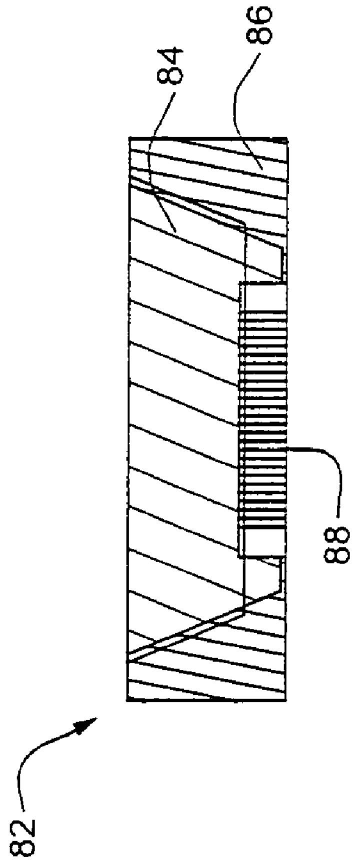
FIG. 7B is a Bradbury-Nielsen gate according to one embodiment of the present invention.
Figure 7C:
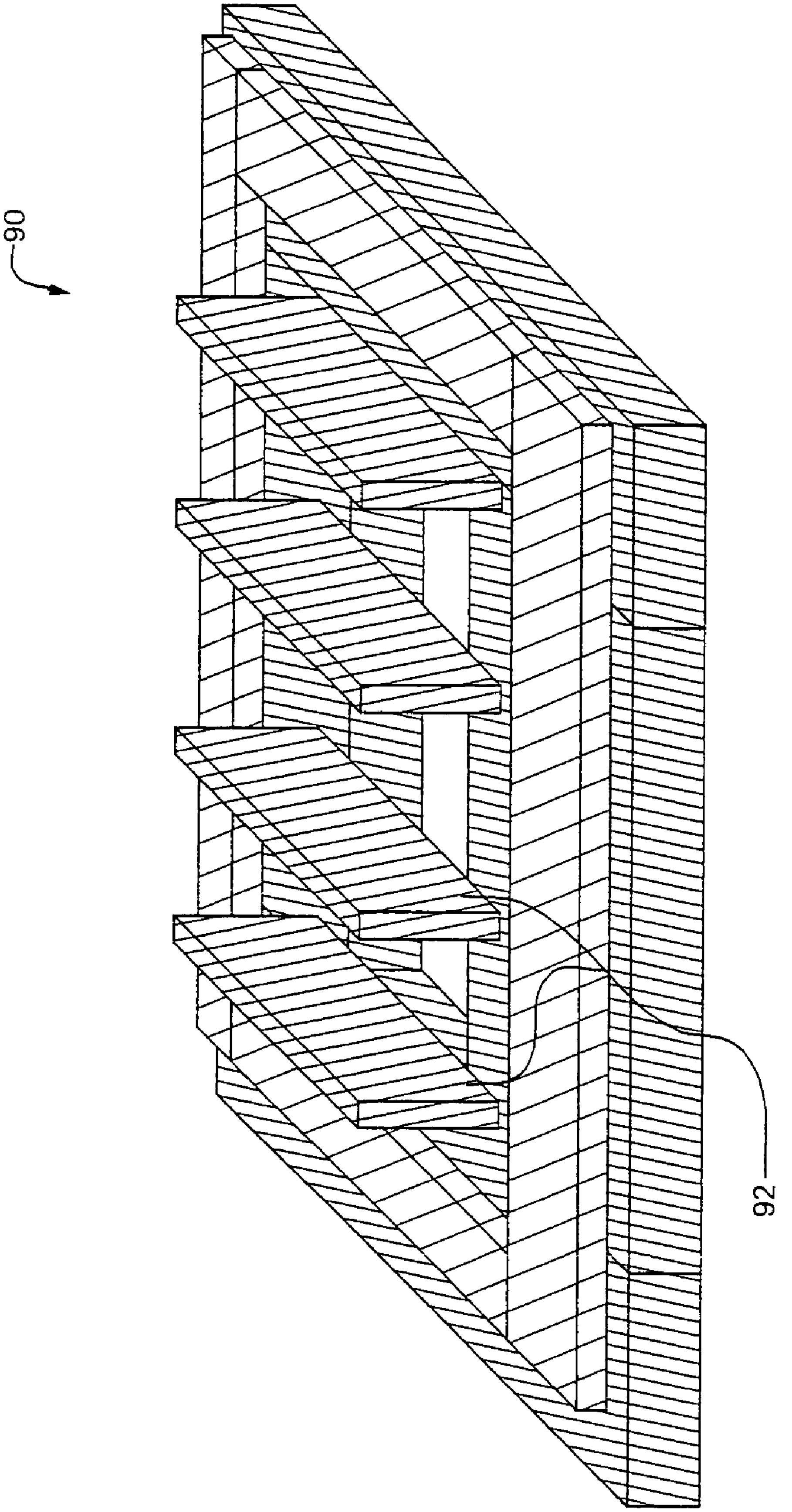
FIG. 7C illustrates a gate element according to one embodiment of the present invention.

The present invention includes a method of manufacturing gating grids such as Bradbury Nielson gates by assembling separately machined parts, each containing a portion of the grid elements, e.g., electrodes. The invention includes a microfabricated Bradbury Nielson gate that is realized by the aligned bonding of gate elements, wherein each gate element contains a portion of the interleaved grid elements that make up the Bradbury Nielson gate. In one embodiment, the Bradbury Nielson gate is fabricated by the assembly of two gate elements, wherein each gate element contains one-half of the interleaved grid elements that make up the Bradbury Nielson gate. Various embodiments of the invention are illustrated in FIGS. 7A-C. FIG. 7A illustrates the joining of gate element 70, having grid elements 72 and alignment feature 74, with gate element 76, having grid elements 78 and alignment feature 80, to form a Bradbury Nielson gate. In one embodiment, gate element 70 and gate element 76 are separated by an insulating layer. FIG. 7B illustrates Bradbury Nielson gate 82 including gate elements 84 and 86 and grid elements 88. FIG. 7C shows an example gate element 90 which includes grid elements 92.

The advantages of the gate designs described herein include reduced fabrication complexity, especially in metal coating and connections of the interleaved electrodes, and increased flexibility in the choice of materials and dimensions. The fabrication of each gate element can use traditional machining or high precision micromachining to give micron to submicron manufacturing precision. Micromachining is a rather eclectic collection of microfabrication techniques that derives from similar techniques used in the fabrication of integrated solid-state electronic circuits.

There are a number of alternative means of achieving the same or similar structures in silicon and in other substrates, including metals, glass and ceramic. For example, instead of silicon micromachining to produce the electrodes, patterned electroplating (LIGA) or lift-off processes can be employed. During the assembly process, it can be important that the two halves are aligned before the grid electrodes approach, so that no damage occurs during assembly. In this embodiment, a third layer or substrate is used to key together the two halves of the gate during assembly. Alignment features, such as for example, alignment keys or holes, can be integrated onto one or each half of the gate assembly to be used by pins in an alignment jig. The halves can also be aligned and bonded using numerous other methods. For example, a bond-aligner, such as the Karl Suss BA-6, which uses a combination of optical imaging and mechanical tooling, can be used to align and bring the two halves into contact. Bonding can be achieved by many methods, including adhesive bonding, anodic bonding, mechanical latching or fixturing, fusion bonding and thermoplastic molding.

Figure 8A:
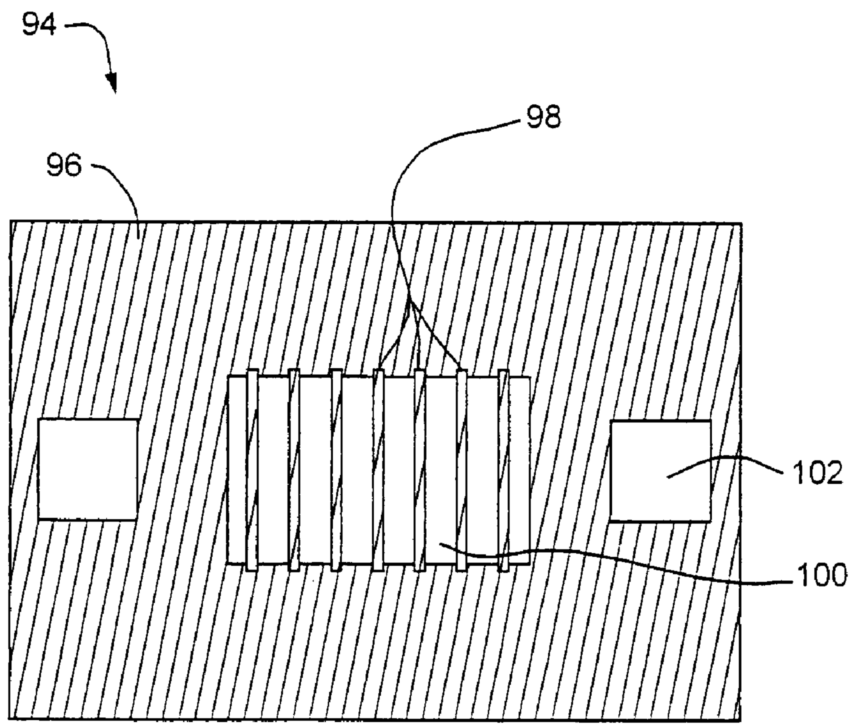
FIGS. 8A-G illustrate a method for fabricating and assembling a Bradbury-Nielsen gate.
Figure 8B:
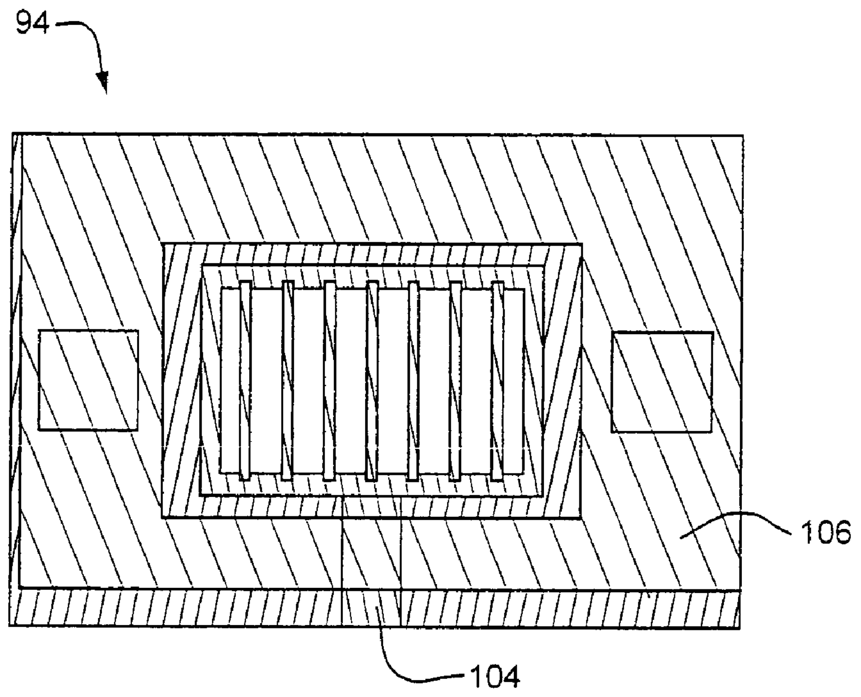
Figure 8C:
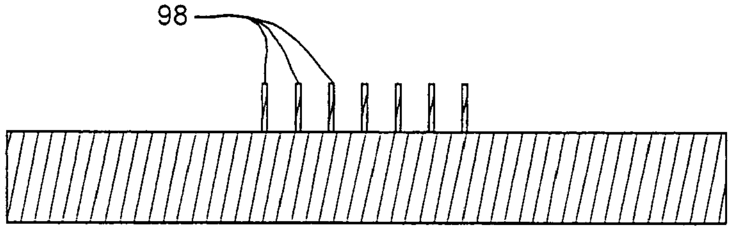
Figure 8D:
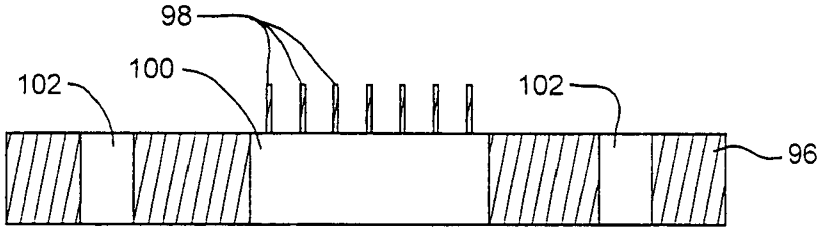
Figure 8E:
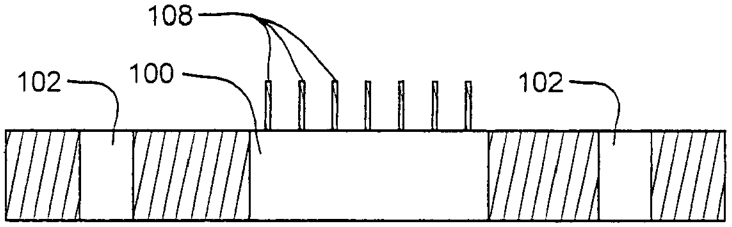
Figure 8F:
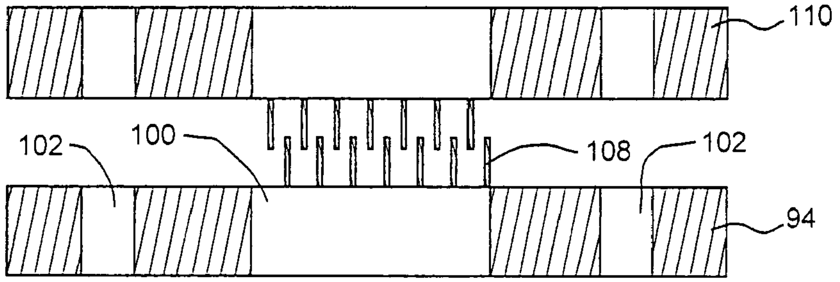
Figure 8G:
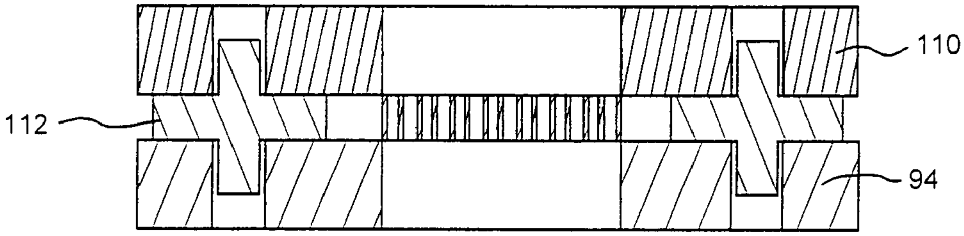

One method for fabricating a gating grid is illustrated in FIGS. 8A-G. Starting with a silicon wafer, gate element 94 is made. A micromachining mask material is deposited or grown on silicon wafer 96, e.g., using silicon nitride for KOH etching or silicon dioxide for deep reactive ion etching (DRIE). Then, grid elements 98 are photopatterned and etched, e.g., using DRIE or KOH etching or another patterned etching process. Then, the back side of the wafer (opposite grid elements 98) is photopatterned and gate window 100 and alignment features 102 are micromachined. In one embodiment, gate element includes metal lead 104. Optionally, insulation 106 can be applied to the gate element. For example, a thin oxide can be thermally grown on the gate element. Next, a thin film of metal (e.g., Cr/Au) can be applied onto the electrodes to form metalized grid elements 108. In one embodiment, a shadow mask is used to confine the metal to all sides of the electrodes and to realize a contact pad or metal trace for connection of a cable. Gate elements 94 and 110 are assembled, for example, as shown in FIGS. 8F and 8G. In one embodiment, gate elements 94 and 110 are each fabricated in the same manner and assembled using intermediate, insulating layer 112, which keys into alignment features 102. Intermediate, insulating layer 112 can be a plastic film, e.g., a preformed or molded polymer, or a micromachined insulator, e.g., glass. Intermediate, insulating layer 112 can also serve as the support for electrode leads, e.g., a cable.

Figure 9A:
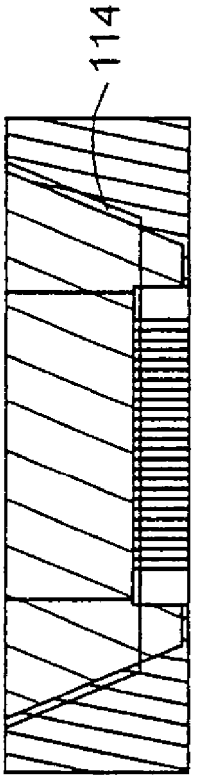
FIG. 9A illustrates a cut away view of one embodiment of the present invention showing a method for aligning and assembling a Bradbury-Nielsen gate.
Figure 9B:
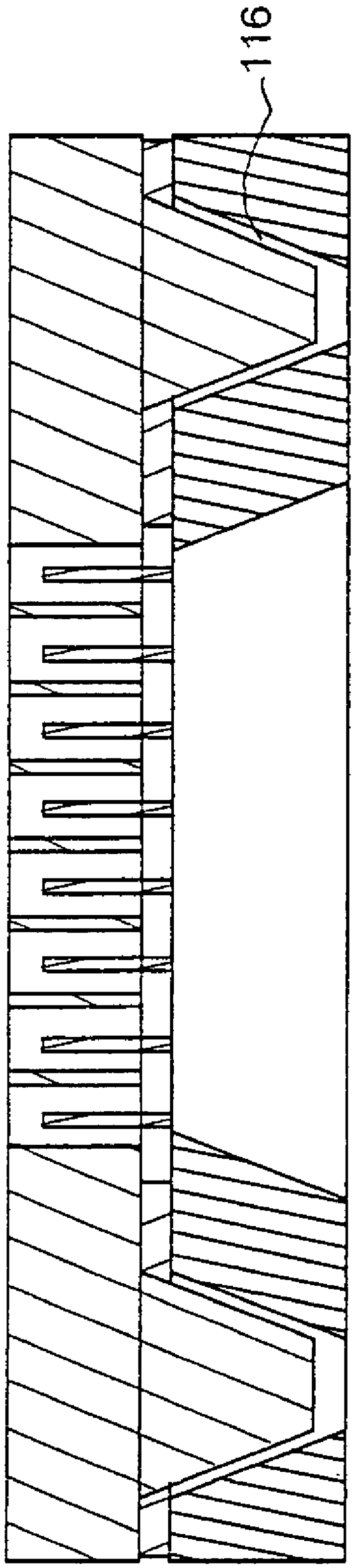
FIG. 9B illustrates a cut away view of one embodiment showing a method for aligning and assembling a Bradbury-Nielsen gate.

Many alternative structures can be realized to achieve the same results. For example, alignment features 114 and 116, e.g., alignment keys, can be machined into the gate elements, as shown in FIGS. 9A and 9B. Here, the sloping sidewalls obtained by crystallographic etching of silicon are used to key the two gate elements together. The sidewalls are defined by the {111} crystal planes, and as such have highly accurate and reproducible inclination to the substrates' top surface, and to one another.

Figure 10:
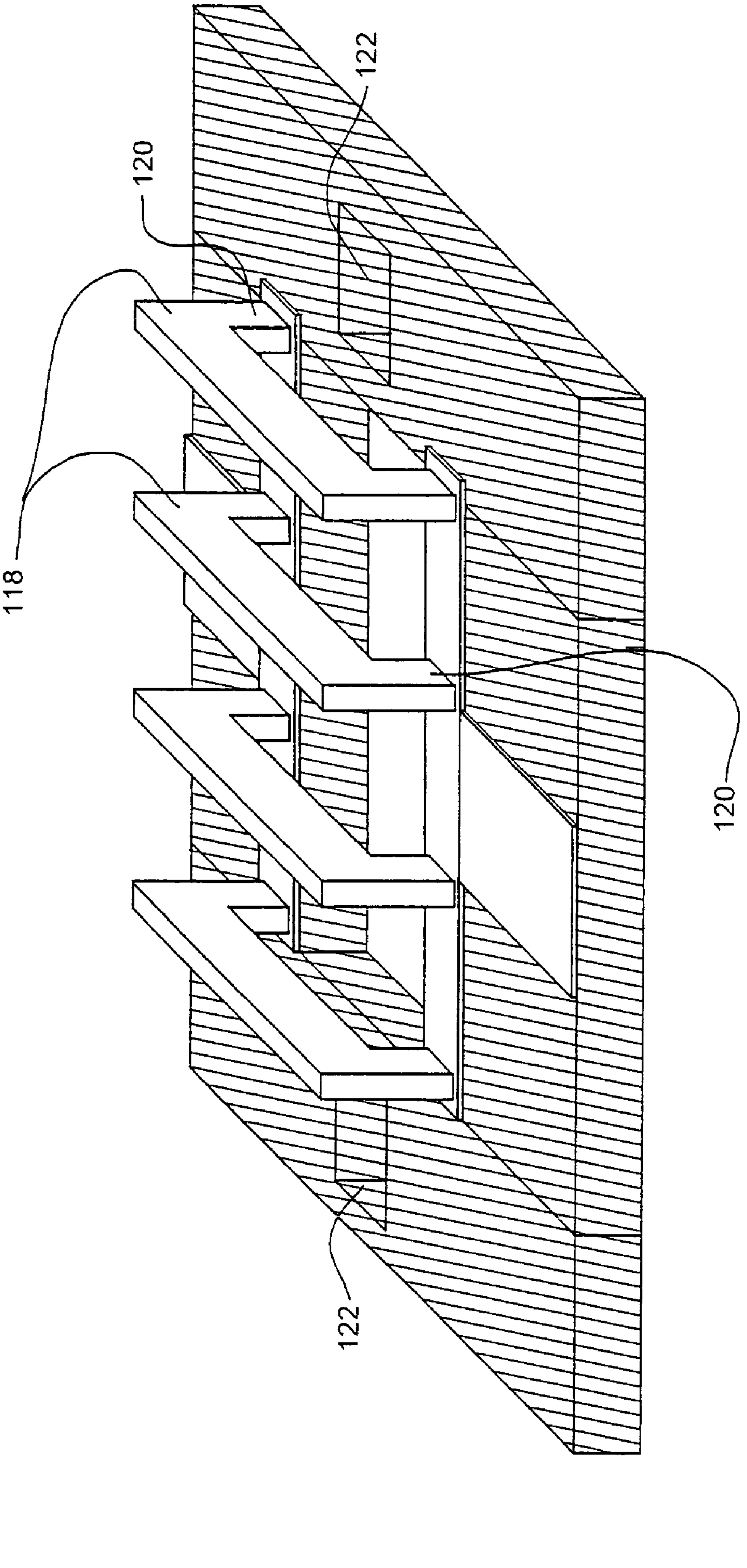
FIG. 10 shows a gate element according to one embodiment of the present invention wherein the electrodes are offset from the substrate region.
Figure 11A:
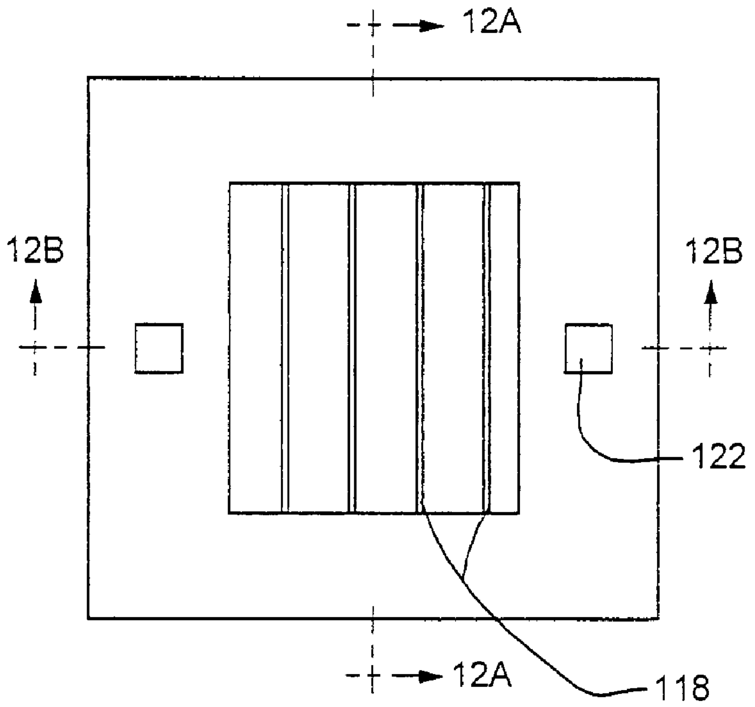
FIG. 11A is a top view of an example of a gate element.
Figure 11B:
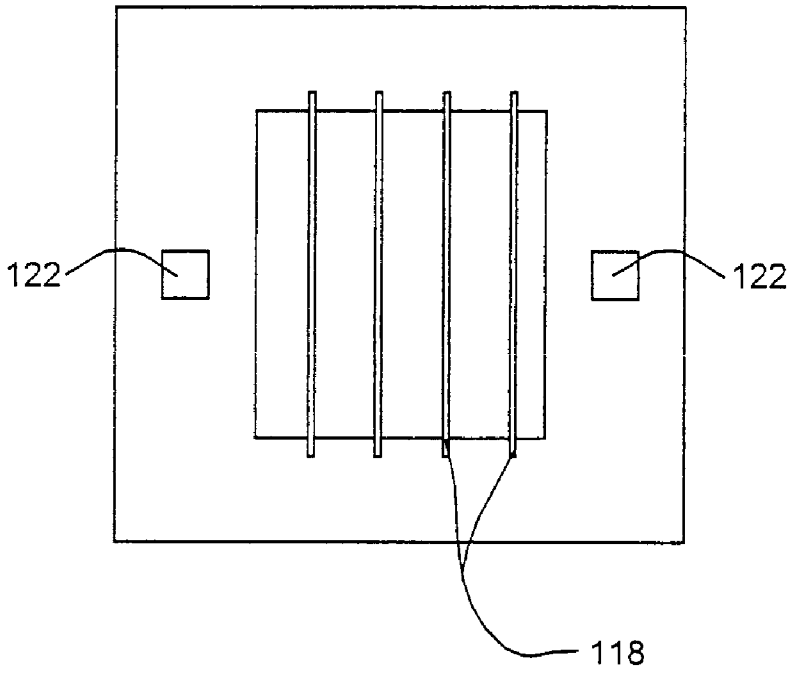
FIG. 11B is a bottom view of the gate element of FIG. 11A.
Figure 12A:
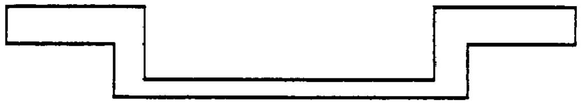
FIG. 12A is a cross-section of the gate element of FIG. 11A along line A-A.
Figure 12B:
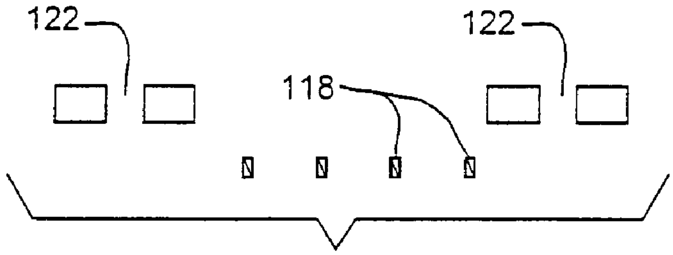
FIG. 12B is a cross-section of the gate element of FIG. 11A along line B-B.
Figure 12C:
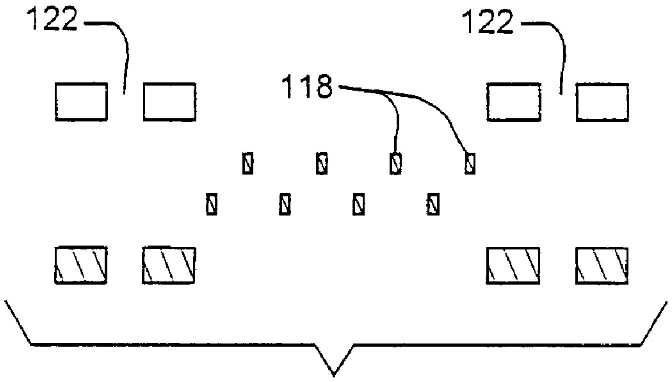
FIG. 12C is a cross-section of the gate element of FIG. 11A along line B-B and a cross-section of another gate element along a similar line.

In the embodiments described supra, the thickness of the insulating layer between the two substrates is limited to that of the grid element, e.g., electrode, height. In the embodiment shown in FIG. 10, this is remedied by setting grid elements 118 on legs 120, which offset the grid elements from the substrate. The insulator thickness is now determined by the height of the legs, instead of the electrodes, adding another degree of freedom to the design. In one embodiment, only the grid elements and connections to a broadside microstripline are metalized, to optimize the electrical properties of the gate. The illustrated gate element also contains alignment features 122. FIGS. 11A and B show, respectively, top and bottom views of the device illustrated in FIG. 10. FIGS. 12A and B show cross-sections of the gate element of FIG. 11A. FIG. 12C shows a cross-section of the gate element of FIG. 11A along line B-B and a cross-section of another gate element along a similar line before the two gate elements are assembled.

In one aspect, the present invention also includes a process of gating grid microfabrication that includes the following steps. Starting with at least one silicon wafer, gate elements are made. In some embodiments, a layer of mask material, e.g., silicon dioxide, is formed on a silicon wafer substrate. For example, a layer of silicon dioxide can be thermally grown on the wafer substrate. Next, each substrate can be coated, e.g., spin coated, with photoresist and a portion of the grid elements can be photopatterned, the photopattern defining the grid elements' length and width. The mask material layer is then etched, e.g., with hydrofluoric acid (HF), and the photoresist is removed. Then, the substrate can be coated with photoresist again and a grid element platform can be photopatterned. Next, the silicon substrate can be etched, e.g., using DRIE, to a depth equal to the leg height minus the grid elements' height. The photoresist can be then removed. In some embodiments, DRIE can be used to etch to a depth of the grid element's height, using the patterned mask material, e.g., silicon dioxide, as an etch mask. In some embodiments, the back side of the wafer (opposite the grid elements) is photopatterned and etched, e.g., with DRIE, to form alignment keys and a gate window. in some embodiments, both alignment keys and gate window are etched in one stop. in other embodiments, the alignment keys and gate window are formed sequentially. Optionally, insulation can be applied to the gate element. For example, a thin oxide can be thermally grown on the gate element. A thin film of metal (e.g., Cr/Au) can be deposited onto the grid elements, for example, using a shadow mask to confine the coating to all sides of the electrodes. A thin film of metal (e.g., Cr/Au) can be deposited onto the grid elements to form a contact pad or metal trace for connection of a cable. Finally, gate elements are assembled to form the gating grid. For example, two gate elements, each fabricated in the same manner, are joined using an intermediate, insulating layer, which keys into alignment features of the gate elements. The intermediate, insulating layer, can include a plastic film, e.g., a preformed or molded polymer, or a micromachined insulator, e.g., glass. The intermediate layer can also support electrode leads, e.g., a cable.

Figure 12D:
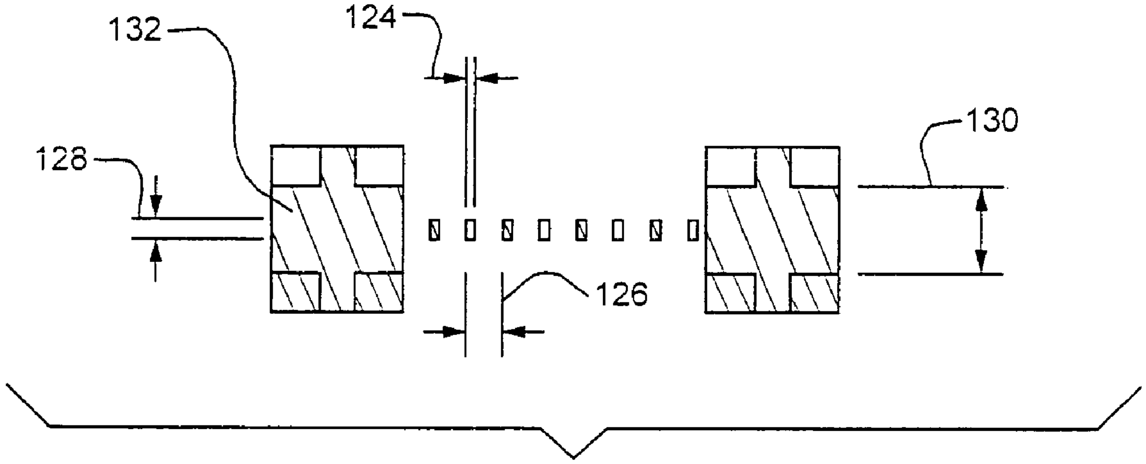
FIG. 12D is a cross-section of an assembled Bradbury-Nielsen gate showing the gate element of FIG. 11A along line B-B and a cross section of another gate element along a similar line.

FIG. 12D illustrates an assembled Bradbury-Nielsen gate showing the gate element of FIG. 11A along line B-B and a cross section of another gate element along a similar line. FIG. 12D shows relative sizes and positioning of the grid elements. Dimensions 124 and 126, which can be on the order, for example, of 10-100 um, because they determine the physical thickness of the gate along the flight direction, 128. These dimensions can be adjusted to be small compared with the substrate spacing, 130, to reduce parasitic capacitances.

The method disclosed here can be practiced with normal silicon wafers as well as the silicon on insulator (SOI) wafers. Advantageously, the method can be practiced using typical, single-side polished, silicon wafers as opposed to using the much more expensive SOI wafers. Monolithic devices can be made using SOI based fabrication, but the isolated metallization of densely packed electrodes can pose significant fabrication challenges. Furthermore, the range of oxide thicknesses that are readily available on SOI wafers are very restrictive, thus potentially limiting the control over capacitances of the device. The present invention allows the signals to be routed by a variety of methods, including those discussed above with respect to FIGS. 4 and 5, to each half of the device without the need for the insulating layer to electrically isolate them, as is needed with an SOI approach.

There are a number of alternative means of achieving the same or similar structures in silicon and in other substrates, including metals, ceramics, and other semiconductors. For example, instead of using silicon micromachining, described supra, to produce the grid elements, patterned electroplating by a process such as LIGA can be used to create the same or similar structures. Additionally, laser machining can be employed as well as a number of other techniques known in the art. Aligned bonding can also be achieved by different methods. During the assembly process, it can be important that the gate elements are aligned before the grid elements approach, so that no damage occurs during assembly. In one embodiment, a third layer or substrate is used to key together the two halves of the gate during assembly. Alignment features, for example, alignment keys or additional holes, can be integrated onto one or each gate element to be used by pins in an alignment jig. The gate elements can also be aligned using a bond-aligner, such as the Karl Suss BA-6 system, which uses a combination of optical imaging and mechanical tooling to align and subsequently bond substrates together.

While this invention has been particularly shown and described with references to preferred embodiments thereof, it will be understood by those skilled in the art that various changes in form and details may be made therein without departing from the scope of the invention encompassed by the appended claims.

What is claimed is:

1. An apparatus comprising:

a gating grid including a plurality of transmission line elements;

a drive source feed, for providing a drive signal after the gating grid;

a termination network, for terminating the drive signal at the gating grid;

a plurality of source transmission lines, coupled between the drive source and the gating grid;

a like plurality of termination transmission lines, coupled between the gating grid and the termination network; and wherein the drive signal travels through the gating grid from the source transmission lines to the termination transmission lines.

2. An apparatus as in claim 1 wherein the drive signal travels through the grid from the source feed to the termination network.

3. An apparatus as in claim 1 wherein the gating grid, the source transmission lines, and the termination transmission lines provide a set of continuous transmission lines.

4. An apparatus as in claim 1 wherein at least two wire pairs of the gating grid are coupled to a respective one of the source transmission lines.

5. An apparatus as in claim 1 wherein at least one of the source transmission lines and termination transmission lines is a low odd mode impedance transmission line.

6. An apparatus as in claim 1 wherein the low odd mode impedance transmission line is a broadside stripline.

7. An apparatus as in claim 1 wherein the gating grid is a Bradbury Nielson Gate (BNG).

8. An apparatus as in claim 7 wherein the BNG further comprises a plurality of transmission lines having different potentials.

9. An apparatus as in claim 8 wherein a differential characteristic impedance of the gate transmission lines is matched to a differential characteristic impedance of the source transmission lines.

10. An apparatus as in claim 8 wherein a differential characteristic impedance of the gate transmission lines is matched to a differential characteristic impedance of the termination transmission lines.

11. An apparatus as in claim 8 wherein a differential characteristic impedance of the gate transmission lines is matched to a differential characteristic impedance of both the source transmission lines and the termination transmission lines.

12. An apparatus as in claim 1 wherein a differential characteristic impedance of elements of the grid are matched to a differential characteristic impedance of both the source transmission lines and the termination transmission lines.

13. An apparatus as in claim 1 additionally comprising:

a bias tee network disposed between the drive source feed and the gating grid.

14. An apparatus as in claim 13 wherein the bias tee network converts a single ended pulse source drive signal to a balanced dual polarity transmission line signal.

15. An apparatus as in claim 13 wherein the bias tee network provides an independently adjustable bias voltage.

16. An apparatus as in claim 1 wherein the termination network is a high pass network.

17. An apparatus as in claim 1 wherein the gate is formed of two component parts, with each component part having one-half of the grid elements of the gate.

18. An apparatus as in claim 17 wherein each component part comprises grid elements of a same potential.

19. A Bradbury Nielson gate comprising:

a gating grid, comprising a plurality of grid elements, with each grid element comprising a multiconductor transmission line;

a source connection, coupling the grid elements to a plurality of source transmission lines;

a termination connection, coupling the grid elements to a plurality of termination transmission lines; and wherein a characteristic impedance of the grid elements is matched to a characteristic impedance of both the source transmission lines and termination transmission lines.

* * * * *